United States Patent
Backman et al.

(10) Patent No.: US 10,861,665 B1
(45) Date of Patent: Dec. 8, 2020

(54) INERT ENVIRONMENT FUSIBLE LINKS

(71) Applicant: Rosemount Aerospace Inc., Burnsville, MN (US)

(72) Inventors: Roger Alan Backman, Minneapolis, MN (US); David P. Potasek, Lakeville, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 0 days.

(21) Appl. No.: 16/593,714

(22) Filed: Oct. 4, 2019

(51) Int. Cl.
*H01H 85/041* (2006.01)
*H01H 85/00* (2006.01)
*H01H 69/02* (2006.01)
*H01H 85/175* (2006.01)

(52) U.S. Cl.
CPC .......... *H01H 85/003* (2013.01); *H01H 69/02* (2013.01); *H01H 85/0411* (2013.01); *H01H 85/175* (2013.01); *H01H 2085/0414* (2013.01); *H01H 2223/002* (2013.01); *H01H 2223/044* (2013.01)

(58) Field of Classification Search
CPC .... H01H 69/02; H01H 69/022; H01H 85/003; H01H 85/0411; H01H 85/12; H01H 85/165–1755; H01H 2085/0412; H01H 2085/0414; H01H 2223/002; H01H 2223/044
See application file for complete search history.

(56) References Cited

U.S. PATENT DOCUMENTS

| | | | | |
|---|---|---|---|---|
| 5,151,611 A | * | 9/1992 | Rippey | H01L 23/5256 257/E23.149 |
| 5,196,819 A | * | 3/1993 | Roberts | H01H 85/046 29/623 |
| 5,923,239 A | * | 7/1999 | Krueger | H01H 69/022 337/152 |
| 8,081,057 B2 | | 12/2011 | Chiu | |
| 8,525,277 B2 | | 9/2013 | Inaba | |
| 9,878,904 B1 | | 1/2018 | Potasek | |
| 2001/0026185 A1 | * | 10/2001 | Sher | H03K 19/1732 327/525 |
| 2004/0184211 A1 | * | 9/2004 | Bender | H01H 85/0047 361/104 |
| 2005/0087836 A1 | * | 4/2005 | Wu | H01L 27/101 257/529 |

(Continued)

FOREIGN PATENT DOCUMENTS

| | | |
|---|---|---|
| EP | 2400540 A1 | 12/2011 |
| EP | 2955151 A1 | 6/2015 |
| WO | 2007060414 A1 | 5/2007 |

OTHER PUBLICATIONS

Extended European Search Report dated Jul. 21, 2020, received for corresponding European Application No. 19215405.2, 8 pages.

*Primary Examiner* — Jacob R Crum
(74) *Attorney, Agent, or Firm* — Kinney & Lange, P.A.

(57) ABSTRACT

A micro-fuse assembly includes a substrate, a number of thin-film micro-fuses on the substrate, and a topping wafer configured to sealingly engage to at least one of the substrate or the thin-film micro-fuses to define a cavity therebetween. The cavity is configured to encapsulate the thin-film micro-fuses within an inert environment sealed within the cavity. A method of encapsulating a micro-fuse assembly within an inert environment using a topping wafer is also disclosed.

17 Claims, 5 Drawing Sheets

(56) References Cited

U.S. PATENT DOCUMENTS

| | | |
|---|---|---|
| 2007/0075822 A1 | 4/2007 | Pachla et al. |
| 2007/0235858 A1 | 10/2007 | Ohara |
| 2008/0191832 A1 | 8/2008 | Tsai |
| 2009/0102595 A1 | 4/2009 | Pachla et al. |
| 2010/0193940 A1 | 8/2010 | Kim et al. |
| 2011/0043963 A1* | 2/2011 | Bultitude ................. H01G 4/40 361/321.4 |
| 2013/0234822 A1* | 9/2013 | Aurich ................... H01H 85/12 337/416 |
| 2018/0315564 A1* | 11/2018 | Sherrima ............. H01H 69/022 |

* cited by examiner

INERT ENVIRONMENT FUSIBLE LINKS

CROSS-REFERENCE TO RELATED APPLICATION(S)

This application is related to U.S. patent application Ser. No. 16/418,332, entitled "FUSE ASSEMBLY AND METHOD OF MAKING", filed May 21, 2019.

BACKGROUND

The present disclosure relates to electrical fuses, and more particularly, to providing an inert environment for a thin-film micro-fuse assembly.

SUMMARY

A micro-fuse assembly includes a substrate, a number of thin-film micro-fuses on the substrate, and a topping wafer configured to sealingly engage to at least one of the substrate or the thin-film micro-fuses to define a cavity therebetween. The cavity is configured to encapsulate the thin-film micro-fuses within an inert environment sealed within the cavity.

A method of encapsulating a micro-fuse assembly that includes a substrate and a number of thin-film micro-fuses on the substrate within an inert environment using a topping wafer that is configured to sealingly engage to at least one of the substrate or the plurality of thin-film micro-fuses to define a cavity therebetween. The method includes creating an inert environment around the micro-fuse assembly, and bonding the topping wafer to the at least one of the substrate or the thin-film micro-fuses, thereby encapsulating the thin-film micro-fuses within the inert environment sealed within the cavity.

DETAILED DESCRIPTION

Thin film micro-fuses can be used as programming switches in micro-electrical devices and microelectromechanical systems (MEMS). In a first (i.e., on) state, a micro-fuse can short a precision resistance device by providing a low resistance path for electrical current to flow. In a second (i.e., off) state, the micro-fuse is an open circuit, thereby placing the precision resistance device in an electrical circuit. After manufacturing a precision resistance device array and an accompanying thin-film micro-fuse assembly, programming can be performed by driving a programming current level through one or more selected micro-fuses, thereby "blowing" (i.e., opening, turning off) the selected micro-fuses by melting a fuse element contained in each of the selected micro-fuses. However, arcing, plasma discharge, and/or molten metal splattering and re-deposition that can occur during the blowing of a micro-fuse can have undesirable effects. When a programming current is supplied through the fuse element of a micro-fuse, the conduction of current causes rapid heating, resulting in melting and/or vaporizing of the metal. Because the micro-fuse is surrounded by air, which can include oxygen, water vapor, and/or other contaminants that can cause a micro-explosion, arcing, and/or plasma discharge can occur, leading to a metallic spray pattern in the vicinity of the micro-fuse. The amount of splatter can be affected by ionizing gases and/or other airborne contaminants surrounding the micro-fuse.

Figure 1A:
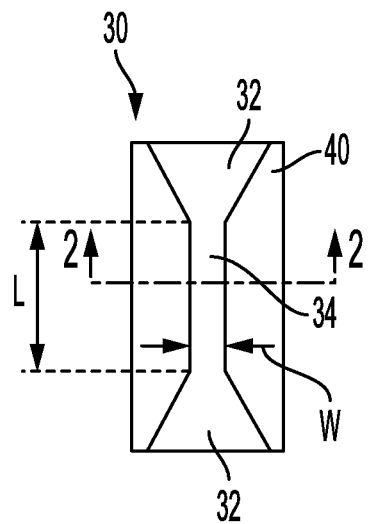
FIG. 1A is a top view of a thin-film micro-fuse in an inert environment.
Figure 1B:
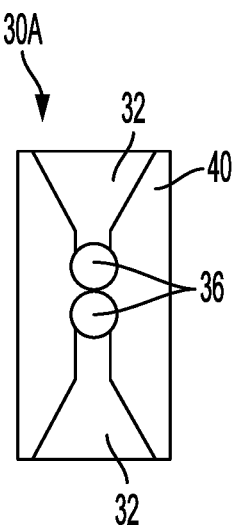
FIG. 1B is a top view of the thin-film micro-fuse shown in FIG. 1A at the point of melting while subjected to a programming current.
Figure 1C:
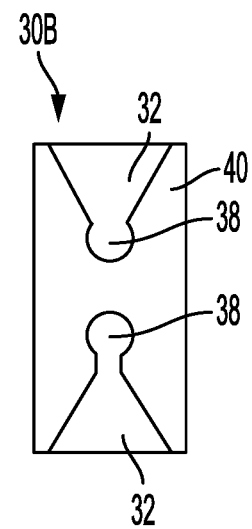
FIG. 1C is a top view of the thin-film micro-fuse shown in FIG. 1B after melting and re-solidification of the fuse element.
Figure 2:
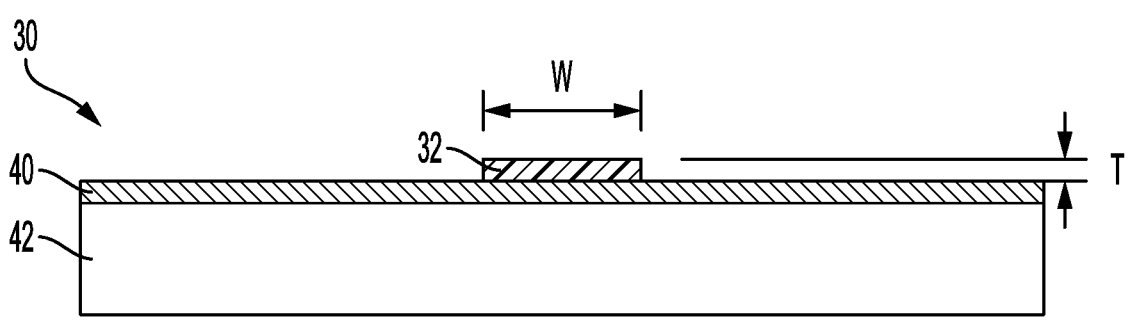
FIG. 2 is a cross-sectional view of the thin-film micro-fuse shown in FIG. 1A

The present disclosure is directed to a system and method of providing a protective, inert environment around micro-fuses. FIG. 1A is a top view of a thin-film micro-fuse in an inert environment. FIG. 1B is a top view of the thin-film micro-fuse shown in FIG. 1A at the point of melting when subjected to a programming current. FIG. 1C is a top view of the thin-film micro-fuse shown in FIG. 1B after melting and re-solidification of the fuse element. FIG. 2 is a cross-sectional view of the thin-film micro-fuse shown in FIG. 1A. Shown in FIGS. 1A-1C and 2 are inert-environment micro-fuse 30, 30A, 30B, fuse terminal 32, fuse element 34, molten metal 36, solidified metal wicks 38, and insulating layer 40. Fuse element length L, width W, and thickness T are labeled in FIGS. 1A and 2. Micro-fuse 30 is manufactured in the first (i.e., on, closed) state as shown in FIG. 1A, with fuse element 34 providing an electrically-conductive path between fuse terminals 32 which can be connected to other circuit components (not shown in FIGS. 1A-1C and 2). Fuse terminals 32 and fuse element 34 can be made of a metal having a relatively low melting point, and are deposited on insulating layer 40 which is supported on substrate 42. Micro-fuse 30 can change state from on to off (i.e., open to closed) by driving a programming current level through micro-fuse 30, which creates an electrical current density in fuse element 34 that is sufficient to create molten metal 36 (shown in FIG. 1B) as a result of a rapid temperature rise. Micro-fuses 30 can be referred to as fusible links. In the illustrated embodiment, fuse terminals 32 and fuse element 34 are made of aluminum, having a melting point of about 660° C., and insulating layer 40 is silicon dioxide. In some embodiments, fuse terminals 32 and fuse element 34 can be made of any metal or alloy having a melting temperature of less than about 700° C., and insulating layer 40 can be any material that provides acceptable properties of electrical insulation, thermal isolation, and material adhesion for fuse terminals 32 and fuse element 34. Non-limiting examples of materials that can be used for insulating layer 40 include oxides and nitrides of various materials, including without limitation ceramics and other dielectrics. In the illustrated embodiment, insulating layer 40 is deposited on a substrate (not shown in FIGS. 1A-1C and 2). In the illustrated embodiment, fuse element length L is about 15 µm, fuse element width W is about 4 µm, and fuse element thickness is about 1 µm, however these dimensions can vary in different embodiments. For example, in some embodiments, fuse element length can range from about 2-30 µm, fuse element width can range from about 0.5-10 µm, and fuse element thickness can range from about 0.1-5 µm. In other embodiments, any one or more dimensions can be less than or greater than any of these exemplary range of values.

Attention will first be directed to the behavior of micro-fuse 30 in an inert environment. The system and method for providing the inert environment will be described later, in FIGS. 4-5. Micro-fuse 30, 30A, 30B is contained within an inert environment (not shown in FIGS. 1A-1C and 2). In the illustrated embodiment, the inert environment is a vacuum (i.e., absence of gasses). In some environments, the inert environment can be nitrogen or argon. In other embodiments, the inert environment can be any other inert gas, and/or any mixture of inert gases including nitrogen and/or argon. In any of these environments, the inert environment can be one or more inert gases ranging in pressure from about 0-2 Atm. (0-200 KPa). In some embodiments, the inert environment can be created by drawing a vacuum surrounding micro-fuse 30, then back-filling the environment with an inert gas. In some of these environments, the process of drawing a vacuum and back-filling with an inert gas can be repeated any number of times to assist in flushing out gaseous and/or particulate contaminants. In other embodiments, other steps can be performed to create an inert environment. In some embodiments, the inert environment can be a vacuum. An exemplary vacuum has a pressure of less than about 10 Pa.

Referring again to FIGS. 1A-1C and 2, when a programming current is supplied through micro-fuse 30, the conduction of current through fuse element 34 causes rapid heating and melting, which can occur over a time period of several microseconds. In some embodiments, this time period can be about a microsecond, or less. In an exemplary embodiment, a programming current is an electrical current value that results in a current density of about 1 Amp/(m)$^2$ in fuse element 34. In the illustrated embodiment, fuse element 34 is aluminum having a melting temperature of about 660° C., resulting in molten metal 36 as shown in FIG. 1B. Viscous forces pull molten metal 36 towards each side of fuse element 34 (i.e., toward respective fuse terminals 32), generating a narrowing section in the middle as shown in FIG. 1B. At this point, molten metal 36 bridges respective fuse terminals 32, which viscously separates in the inert environment. At the instant of separation, electrical conduction by micro-fuse 30B stops, thereby allowing molten metal 36 to continue retracting toward respective fuse terminals 32 and cool, thereby forming solidified metal wick 38 near each respective fuse terminal 32 as shown in FIG. 1C. Because the inert environment is devoid of ionizing gases (e.g., oxygen, water vapor), arcing and plasma discharge does not occur after being opened by a programming current. Accordingly, the integrity of micro-fuse 30B is maintained, and the risk of undesirable subsequent electrical effects is eliminated or significantly reduced.

Figure 3:
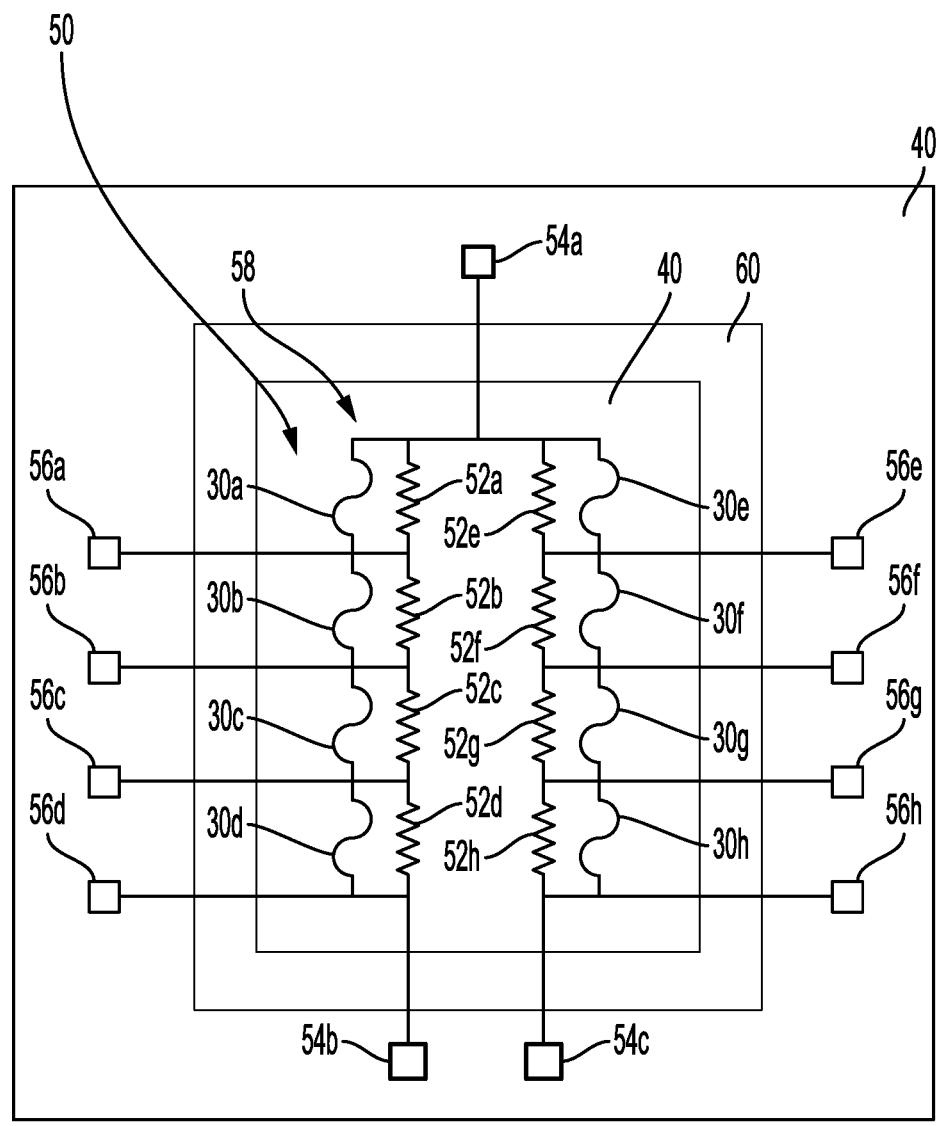
FIG. 3 is a schematic diagram of a precision circuit.

Several micro-fuses 30 can be used in an array with precision circuit components to produce a programmable precision circuit. Precision resistors are exemplary precision circuit components that can be used with an array of micro-fuses 30, and will be described as an exemplary embodiment. FIG. 3 is a schematic diagram of a precision circuit. Shown in FIG. 3 are micro-fuses 30, insulating layer 40, precision circuit 50, precision resistors 52, resistor array terminals 54, programming terminals 56, precision resistor network 58, and planar perimeter region 60. The description of insulating layer 40 is substantially similar to that provided above in regard to FIGS. 1A-1C. Precision circuit 50 is contained within an inert environment (not shown in FIG. 3), having a description substantially similar to that described above in regard to FIGS. 1A-1C. Precision circuit 50 can be referred to as an inert-environment thin-film micro-fuse assembly and precision resistor network. In the illustrated embodiment, precision circuit 50 includes precision resistor network 58. In other embodiments, precision circuit 50 can include an array of micro-fuses 30 and other circuit components. Referring again to FIG. 3, precision resistor network 58 includes precision resistors 52a-52h each being electrically-bridged by an associated micro-fuse 30a-30h, thereby forming two series resistor arrays (i.e., precision resistors 52a-52d, and precision resistors 52e-52h). Precision resistors 52 can be referred to as precision thin-film resistors. The resistance values of precision resistors 52 in each series resistor array can be of different values, thereby allowing a number of series resistance combinations to be programmed into each series resistor array by selectively programming (i.e., opening) associated micro-fuses 30. In an exemplary embodiment, precision resistors 52 can be made of polysilicon and/or nickel-chrome alloy (e.g., NICHROME™). During the programming of precision circuit 50, a programming current is driven through one or more micro-fuses 30 by using a respective resistor array terminal 54 and/or programming terminal 56, thereby opening the particular micro-fuse 30. After the programming operation has been completed, the resulting resistance of each precision resistor network 58 is determined by the resulting combination of micro-fuses 30 and precision resistors 52, with resistor array terminals 54 being used to electrically connect precision circuit 50 to an external circuit (not shown in FIG. 3). The network of micro-fuses 30 and precision resistors 52 is built on and/or in insulating layer 40, which is located on a planar substrate (not shown in FIG. 3). Planar perimeter region 60 encircles the network of micro-fuses 30 and precision resistors 52, defining the outer boundary of what will become the protected inert environment.

Figure 4:
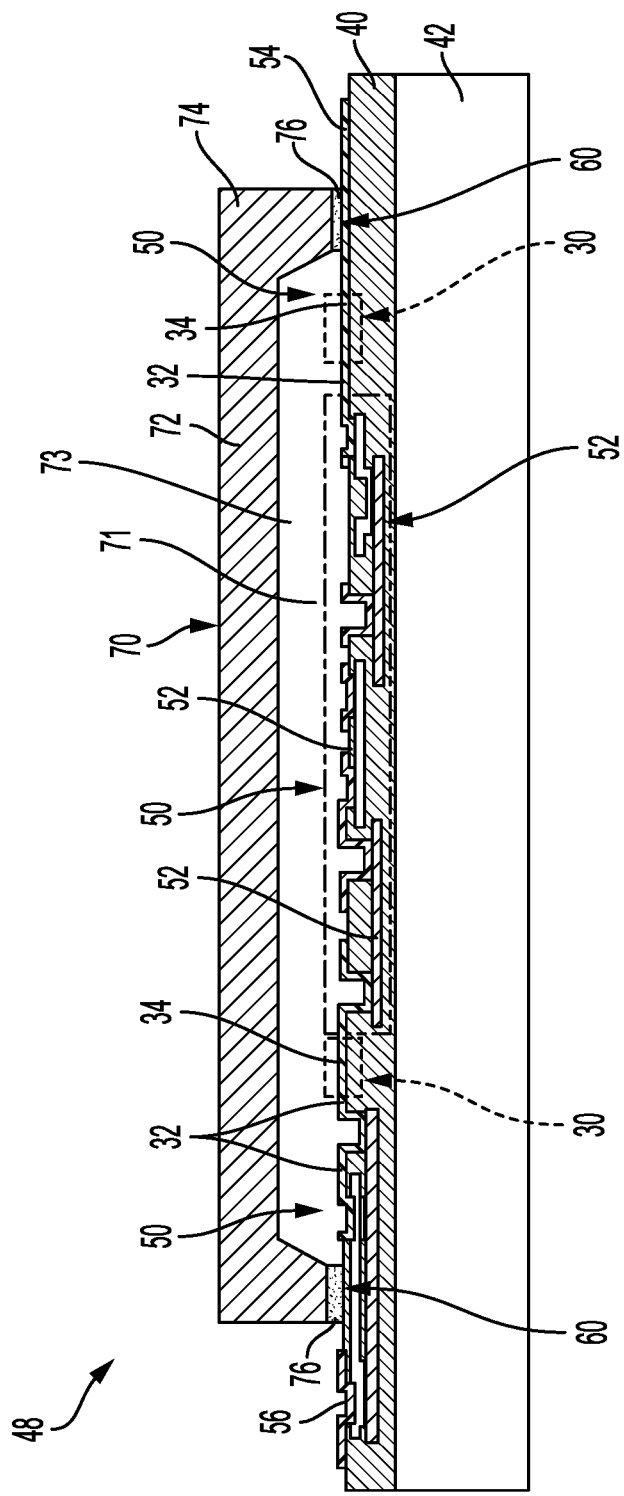
FIG. 4 is a cross-sectional side view of a protected circuit that includes the precision circuit depicted in FIG. 3.

FIG. 4 is a cross-sectional side view of a protected circuit that includes precision circuit 50 depicted in FIG. 3. Shown in FIG. 4 are micro-fuses 30, insulating layer 40, substrate 42, protected circuit 48, precision circuit 50, precision resistors 52, resistor array terminals 54, programming terminals 56, planar perimeter region 60, topping wafer 70, sealed region 71, canopy 72, cavity 73, perimetral sidewall 74, and bond line 76. The descriptions of micro-fuses 30, insulating layer 40, precision circuit 50, and precision resistors 52 are substantially as provided above in regard to FIG. 3. Protected circuit 48 can be referred to as an inert-environment thin-film micro-fuse assembly, or as an inert-environment micro-fuse assembly. Several different types of resistive elements can form any particular precision resistor 52, with non-limiting examples including polysilicon (i.e., doped polysilicon), nickel-chrome alloy (e.g., NICHROME™), and combinations thereof. Resistor array terminals 54 and programming terminals 56, shown schematically and described above in regard to FIG. 4, are contact pads that can be electrically connected to external circuit components. Planar perimeter region 60, described above in regard to FIG. 3, defines the boundary that encircles micro-fuses 30 and precision resistors 52 upon which topping wafer 70 rests. As shown in FIGS. 3-4, planar perimeter region 60 covers insulating layer 40 and conductive metal traces that connect to resistor array terminals 54 and programming terminals 56. Accordingly, bond line 76 is aligned with planar perimeter region 60, and precision circuit 50 is contained within planar perimeter region 60 (i.e., within bond line 76 as shown in FIG. 4).

Referring again to FIG. 4, topping wafer 70 is a structure that includes canopy 72 and perimetral sidewall 74, thereby defining cavity 73 between topping wafer 70, bond line 76, and precision circuit 50. Protected circuit 48 includes precision circuit 50, topping wafer 70, and bond line 76. In the illustrated embodiment, topping wafer 70 is a unitary component defining cavity 73 on the underside (i.e., facing micro-fuses 30 and precision resistors 52), and is made of a rigid dielectric material. In an exemplary embodiment, topping wafer 70 is made of silicon, and cavity 73 is formed by an etching process. In other embodiments, cavity 73 can be formed by any other process, with non-limiting examples including machining and molding. Non-limiting examples of other materials that can be used to make topping wafer 70 include glass, silicon glass, and ceramic. In any of these embodiments, topping wafer 70 can be coated with a dielectric material, with non-limiting examples including silicon nitride (SiNx) and silicon oxide (SiOx). In some embodiments, topping wafer 70 can be made of two or more components that are joined together. Topping wafer 70 is joined to planar perimeter region 60 by bond line 76, thereby forming sealed region 71 as being a sealed protected inert environment around micro-fuses 30 and precision resistors 52. It is to be appreciated that sealed region 71 forms during a bonding operation, as will be described. Prior to bonding, the region that will become sealed region 71 is a void space. The method of providing an inert environment under topping wafer 70 will be described later, in FIG. 5. In the illustrated embodiment, topping wafer 70 is glass and bond line 76 is glass frit. Glass frit bonding (i.e., seal glass bonding, fusion-bonding) can provide a bond line thickness (not labeled in FIG. 4) that ranges from about 1-35 µm. In the illustrated embodiment, the bond line thickness is about 10 µm, and the cavity formed between canopy 72 and precision circuit 50 is about 125 µm. In some embodiments, other materials can be used to form bond line 76, with non-limiting examples including deposited metals joined by thermocompression bonding, eutectic bonding, anodic bonding, preform bonding, and fusion or epitaxial bonding performed on a freshly polished surface. In other embodiments, epoxy, glue, or other adhesive can be used to form bond line 76, thereby joining topping wafer 70 to planar perimeter region 60. In any of these other embodiments, the bond line thickness can be greater than about 35 µm. Those who are skilled in the semiconductor packaging art are familiar with various bonding materials and processes.

In the illustrated embodiment, topping wafer 70 is bonded to planar perimeter region 60 by bond line 76. In some embodiments, topping wafer 70 can be bonded to at least a portion of one or more micro-fuses 30. In a non-limiting exemplary embodiment, topping wafer 70 can be bonded to at least one fuse terminal 32. In other embodiments, topping wafer 70 can be bonded to at least a portion of one or more of the precision circuit components. Topping wafer 70 can protect micro-fuses 30 and/or the precision circuit components from unintentional mechanical damage that could otherwise occur during packaging or handling. Because of their relatively small size, fuse elements 34 can otherwise be particularly susceptible to mechanical damage that could occur from contact with tooling, instrumentation, cleaning devices, and packaging materials.

Figure 5:
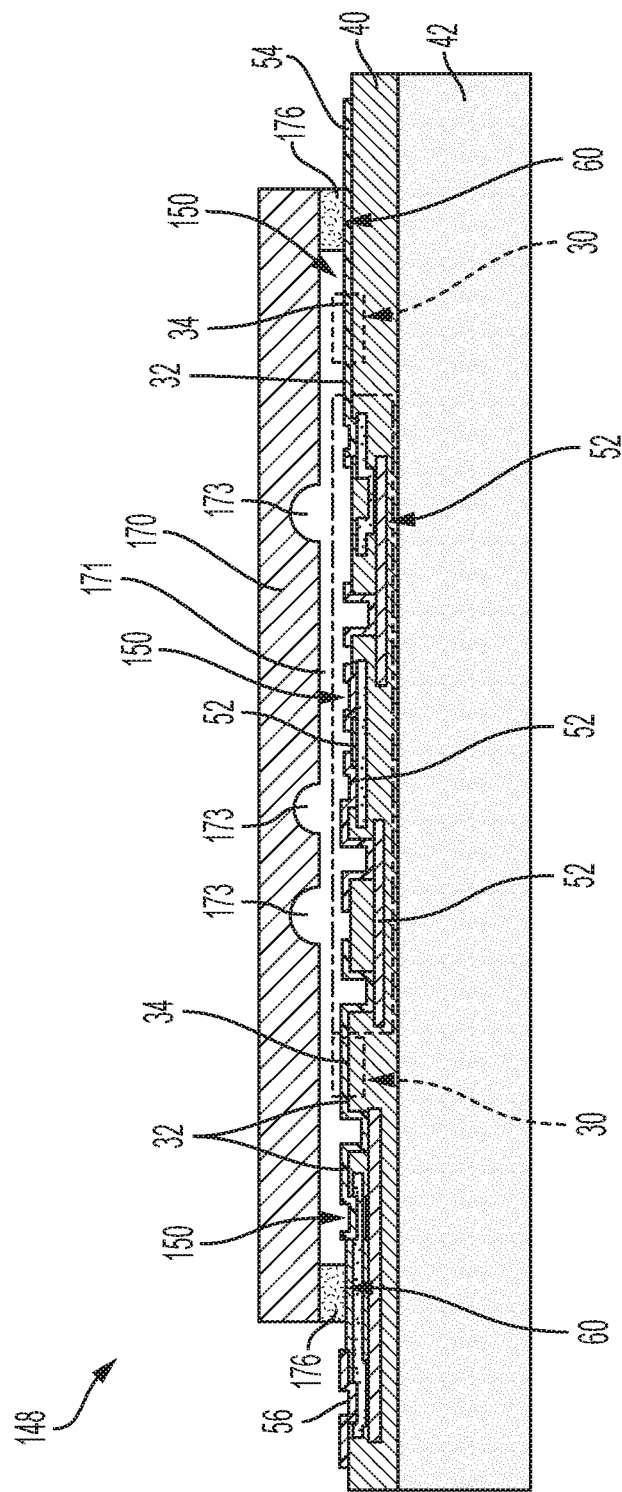
FIG. 5 is a cross-sectional side view of a second embodiment of a protected circuit that includes the precision circuit depicted in FIG. 3.

FIG. 5 is a cross-sectional side view of a second embodiment of a protected circuit that includes precision circuit 50 depicted in FIG. 3. Shown in FIG. 5 are micro-fuses 30, insulating layer 40, substrate 42, precision resistors 52, resistor array terminals 54, programming terminals 56, planar perimeter region 60, protected circuit 148, precision circuit 150, topping wafer 170, sealed region 171, microcavity 173, and bond line 176. The descriptions of micro-fuses 30, insulating layer 40, substrate 42, precision resistors 52, resistor array terminals 54, programming terminals 56, planar perimeter region 60, protected circuit 148, precision circuit 150, sealed region 171, and bond line 176 are substantially as provided above in regard to FIG. 4. Protected circuit 148 can also be referred to as an inert-environment micro-fuse assembly, or as a micro-fuse assembly. Topping wafer 170 is flat, being supported by bond line 176, thereby forming sealed region 171 between topping wafer 170 and precision circuit 150. Topping wafer 170 can be referred to as a planar structure, having a flat or a substantially flat configuration. Accordingly, in the illustrated embodiment, bond line 176 has a bond line thickness that can be sufficient to support topping wafer 170, with sealed region 171 providing an inert environment between topping wafer 170 and the various components of precision circuit 150 (e.g., precision resistors 52).

In some embodiments where the bond line thickness may not be large enough to provide a physical separation between topping wafer 170 and the various components of precision circuit 150, one or more microcavities 173 can be provided in topping wafer 70 as shown in FIG. 5. In an exemplary embodiment, one or more precision resistors 52 can have a physical size that could otherwise contact topping wafer 170. Accordingly, one or more microcavities 173 can be provided on topping wafer 170, each at a location that is directly over associated precision resistors 52.

Referring again to FIGS. 3-5, multiple precision circuits 50, 150 can be fabricated on a common substrate (i.e., substrate 42 extended in planar dimensions) at the same time in an exemplary embodiment. Owing to the relatively small physical dimensions of precision circuit 50, 150, batch processing of numerous precision circuits simultaneously on a common substrate can be advantageous in some embodiments. Those who are skilled in the semiconductor art are familiar with wafer fabrication techniques whereby multiple integrated circuits (i.e., chips) are fabricated on a single "wafer" (i.e., common substrate). Accordingly, the process for producing the inert environment for precision circuit 50, 150 will be described in terms of batch processing multiple precision circuits 50, 150. The number of precision circuits 50, 150 that can be produced on a common substrate can vary as a result of several factors that include the complexity of the particular precision circuit (i.e., the number of individual circuit components), the physical dimensions of each individual precision circuit 50, 150, the size of the particular common substrate, and the geometrical arrangement pattern of the individual precision circuits on the common substrate. It is to be appreciated that in some situations, the size of the particular common substrate can be influenced, at least in part, by the size of the processing equipment used to fabricate the common substrate. Accordingly, multiple topping wafers 70, 170 can be fabricated on a common topping wafer at the same time, with the configuration of individual topping wafers 70, 170 (i.e., size, shape, layout pattern) matching that of the associated common substrate (i.e., precision circuits 50, 150) and/or the various circuit components on each respective precision circuit 50, 150. In this exemplary embodiment, individual cavities 73 and/or microcavities 173 can be fabricated in the common topping wafer simultaneously so that the topology of cavities 73 and/or microcavities 173 matches the circuit topology of the associated common substrate. The common topping wafer can be referred to as a topping wafer array (i.e., an array of one or more topping wafers 70, 170).

Figure 6:
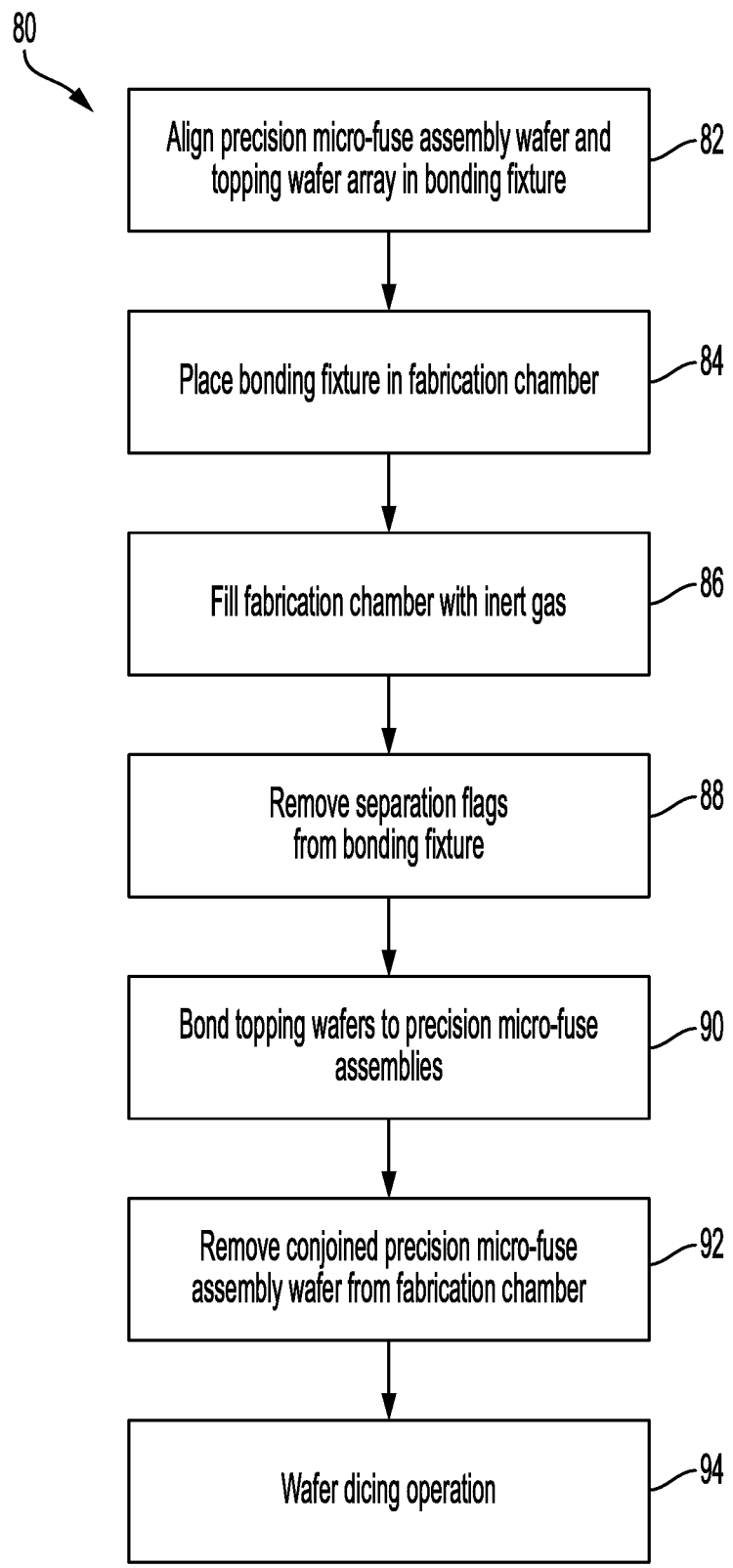
FIG. 6 is a process flow diagram for producing the protected circuit shown in FIG. 4.

FIG. 6 is a process flow diagram for producing protected circuit 48 shown in FIG. 4. Shown in FIG. 6 are process flow 80, align step 82, place step 84, inert step 86, remove flags step 88, bonding step 90, remove step 92, and dicing step 94.

Process flow 80 pertains to one or more precision circuits 50 on a common substrate and one or more topping wafers 70 on a common topping wafer. The present disclosure is directed at an inert environment for a micro-fuse array, with the illustrated embodiment shown in FIG. 4 showing precision circuit 50 including micro-fuses 30 and precision resistors 52. In some embodiments, precision circuit 50 can include additional circuit components. In other embodiments, precision circuit 50 can exclude precision resistors 52. In an exemplary embodiment, precision circuit 50 can include thin-film capacitors (i.e., electrical capacitors), thereby providing a precision capacitance circuit that includes several micro-fuses 30 and a thin-film capacitor network (not shown in FIGS. 3-4). Two or more protected circuits 48 on a common substrate (e.g., substrate 42) can be referred to as a micro-fuse assembly wafer in discussing the batch processing (i.e., process flow 80) of multiple protected circuits 48.

Referring again to FIG. 6, in align step 82, the precision micro-fuse assembly wafer (i.e., two or more protected circuits 48 on a common substrate) and the topping wafer array are aligned in a bonding fixture. In an exemplary embodiment, temporary separation flags can be used to provide the proper spatial alignment. Next, in place step 84, the bonding fixture that holds the aligned precision micro-fuse assembly wafer and topping wafer array is placed in a placed in a fabrication chamber. Next, in inert step 86, an inert environment is established in the fabrication chamber. At this point, bond lines 76 have not been formed on the individual precision circuits 50, and the inert environment is thereby established within individual sealed regions 71 that will be established because of the free fluid communication between the evacuation chamber and the regions surrounding individual precision circuits 50. Inert step 86 can include one or more processes that form the inert environment. In an embodiment, the fabrication chamber is evacuated of air, thereby removing gaseous and particulate contaminates that would otherwise interfere with the programming of micro-fuses 30 described above in regard to FIGS. 1A-1C. In an exemplary embodiment, a vacuum of about 0.02 milliTorr ($1\times10^{-2}$ mTorr, $2.67\times10^{-3}$ Pa) is drawn on the fabrication chamber. In some embodiments, a vacuum of either a lower pressure (i.e., a "harder" vacuum) or a higher pressure (i.e., a "softer" vacuum) can be drawn. Next, in the exemplary embodiment, the fabrication chamber is filled (i.e., back-filled) with an inert gas. Exemplary inert gases include nitrogen and argon. In some embodiments, the aforementioned process of evacuating and backfilling can be repeated one or more times, thereby providing greater removal of gaseous and particulate contaminates from the fabrication chamber. In any of these embodiments, the inert gas can be provided (i.e., backfilled) at any pressure. In some embodiments, the inert gas can be applied at a pressure of about 1 Atm (about 100 KPa). In other embodiments, the inert gas can be applied at a pressure ranging from about 0-2 Atm. (about 0-200 KPa). In yet other embodiments, the inert gas can be applied at a pressure greater than 2 Atm (about 200 KPA). In any of the backfilling steps, an inert gas can be provided that is a different gas and/or has a different pressure than the inert gas that is provided in the final backfill process.

Referring again to FIG. 6, in remove flags step 88, the temporary separation flags that were used in aligning the precision micro-fuse assembly wafer and topping wafer array are removed, in preparation for bonding the precision micro-fuse assembly wafer and topping wafer array. Next, in bonding step 90, the topping wafer array is bonded to the precision micro-fuse assembly wafer, thereby bonding each topping wafer 70 with each associated precision circuit 50, while sealing the so-established inert environment within each associated sealed region 71. In some embodiments, sealed region 71 can be referred to as being hermetically-sealed. It is to be appreciated that during bonding step 90, a planar array of one or more topping wafers 70 is conjoined to a planar array of one or more associated precision circuits 50, each having corresponding layout topologies as described above in regard to FIGS. 3-4. Accordingly, bond lines 76 are formed on each associated precision circuit 50. Next, in remove step 92, the conjoined precision micro-fuse assembly wafer and the topping wafer array is removed from the fabrication chamber. Next, in dicing step 94 the conjoined precision micro-fuse assembly wafer and the topping wafer array is diced up, thereby freeing each individual precision circuit 50. Dicing is known to those who are skilled in the semiconductor art, and can also be referred to as precision machining. Exemplary precision machining processes include mechanical cutting and laser-cutting (e.g., using a femtosecond laser).

Process flow 80 shown and described in FIG. 6 protected circuit 48 shown above in regard to FIG. 4 as an exemplary embodiment. Process flow 80 can be applied to all embodiments of protected circuit 48 (e.g., protected circuit 148 shown above in regard to FIG. 5). Moreover, process flow 80 depicts a non-limiting exemplary embodiment of encapsulating precision circuit 50, 150 in an inert environment.

Discussion of Possible Embodiments

The following are non-exclusive descriptions of possible embodiments of the present invention.

A micro-fuse assembly, comprising: a substrate; a plurality of thin-film micro-fuses disposed on the substrate; and a topping wafer configured to sealingly engage to at least one of the substrate or the plurality of thin-film micro-fuses to define a cavity therebetween, the cavity being configured to encapsulate the plurality of thin-film micro-fuses within an inert environment sealed within the cavity.

The micro-fuse assembly of the preceding paragraph can optionally include, additionally and/or alternatively, any one or more of the following features, configurations and/or additional components:

A further embodiment of the foregoing micro-fuse assembly, wherein the topping wafer is comprised of silicon, glass, or combinations thereof.

A further embodiment of the foregoing micro-fuse assembly, wherein the topping wafer is coated with a dielectric material.

A further embodiment of the foregoing micro-fuse assembly, wherein: the inert environment comprises an inert gas; the inert gas comprises nitrogen, argon, or mixtures thereof; and the inert gas has a pressure that ranges from 0-200 KPa.

A further embodiment of the foregoing micro-fuse assembly, wherein the inert environment is a vacuum having a pressure that is less than 10 Pa.

A further embodiment of the foregoing micro-fuse assembly, wherein: the micro-fuse assembly defines a planar perimeter region; the planar perimeter region surrounds the plurality of thin-film micro-fuses; the topping wafer comprises a perimetral sidewall attached to a canopy; and the perimetral sidewall is configured to be bonded to the planar perimeter region by a bond line, and to support the canopy from the planar perimeter region.

A further embodiment of the foregoing micro-fuse assembly, wherein the bond line is configured to be fusion-bonded between the topping wafer and the planar perimeter region.

A further embodiment of the foregoing micro-fuse assembly, wherein the perimetral sidewall and the canopy are a unitary component and are comprised of silicon, glass, or combinations thereof.

A further embodiment of the foregoing micro-fuse assembly, further comprising an insulating layer disposed on the substrate, wherein: the plurality of thin-film micro-fuses is disposed on the insulating layer; and each of the plurality of thin-film micro-fuses forms: an inlet terminal; an outlet terminal; and a fuse element between the inlet terminal and the outlet terminal.

A further embodiment of the foregoing micro-fuse assembly, wherein each of the plurality of fuse elements is configured to: melt and/or vaporize when conducting an electrical current that exceeds a program current value; and re-solidify after melting and/or vaporizing, thereby forming a solidification globule proximate each associated inlet terminal and outlet terminal.

A further embodiment of the foregoing micro-fuse assembly, wherein each of the plurality of thin-film micro-fuses comprises a metallic material having a melting point that is less than 700° C.

A further embodiment of the foregoing micro-fuse assembly, wherein each of the plurality of thin-film micro-fuses comprises aluminum.

A further embodiment of the foregoing micro-fuse assembly, wherein the topping wafer is configured to protect the plurality of thin-film micro-fuses from mechanical damage.

A further embodiment of the foregoing micro-fuse assembly, further comprising one or more precision circuit components including precision thin-film resistors and/or precision thin-film capacitors.

A further embodiment of the foregoing micro-fuse assembly, wherein the micro-fuse assembly is configured to program one or more of the precision circuit components by applying an electrical current that exceeds the program current value to one or more of the plurality of thin-film micro-fuses.

A further embodiment of the foregoing micro-fuse assembly, wherein the toping wafer further comprises one or more microcavities, each disposed on the toping wafer proximate to an associated precision circuit component.

A method of encapsulating a micro-fuse assembly comprising a substrate and a plurality of thin-film micro-fuses disposed on the substrate within an inert environment using a topping wafer configured to sealingly engage to at least one of the substrate or the plurality of thin-film micro-fuses to define a cavity therebetween, the method comprising: creating an inert environment around the micro-fuse assembly; and bonding the topping wafer to the at least one of the substrate or the plurality of thin-film micro-fuses, thereby encapsulating the plurality of thin-film micro-fuses within the inert environment sealed within the cavity.

The method of the preceding paragraph can optionally include, additionally and/or alternatively, any one or more of the following features, configurations and/or additional components:

A further embodiment of the foregoing method, wherein: the micro-fuse assembly defines a planar perimeter region; the planar perimeter region surrounds the plurality of thin-film micro-fuses; the topping wafer comprises a perimetral sidewall attached to a canopy; and the perimetral sidewall is configured to be bonded to the planar perimeter region by a bond line, and to support the canopy from the planar perimeter region.

A further embodiment of the foregoing method, wherein: the topping wafer is comprised of silicon, glass, or combinations thereof; and the topping wafer is coated with a dielectric material.

A further embodiment of the foregoing method, wherein: the inert environment comprises an inert gas; the inert gas comprises nitrogen, argon, or mixtures thereof; and the inert gas has a pressure that ranges from 0-200 KPa.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A micro-fuse assembly, comprising:
   a substrate;
   a plurality of thin-film micro-fuses disposed on the substrate, each of the plurality of thin-film micro-fuses comprising a metallic material having a melting point that is less than 700° C.;
   one or more precision circuit components including precision thin-film resistors and/or precision thin-film capacitors; and
   a topping wafer configured to sealingly engage to at least one of the substrate or the plurality of thin-film micro-fuses to define a cavity therebetween, the cavity being configured to encapsulate the plurality of thin-film micro-fuses and the one or more precision circuit components within an inert environment sealed within the cavity;
   wherein the micro-fuse assembly is configured to program one or more of the precision circuit components by applying an electrical current that exceeds a program current value to one or more of the plurality of thin-film micro-fuses.

2. The micro-fuse assembly of claim 1, wherein the topping wafer is comprised of silicon, glass, or combinations thereof.

3. The micro-fuse assembly of claim 2, wherein the topping wafer is coated with a dielectric material.

4. The micro-fuse assembly of claim 1, wherein:
   the inert environment comprises an inert gas;
   the inert gas comprises nitrogen, argon, or mixtures thereof; and
   the inert gas has a pressure that ranges from 0-200 KPa.

5. The micro-fuse assembly of claim 1, wherein the inert environment is a vacuum having a pressure that is less than 10 Pa.

6. The micro-fuse assembly of claim 1, wherein:
   the micro-fuse assembly defines a planar perimeter region;
   the planar perimeter region surrounds the plurality of thin-film micro-fuses;
   the topping wafer comprises a perimetral sidewall attached to a canopy; and the perimetral sidewall is configured to be bonded to the planar perimeter region by a bond line, and to support the canopy from the planar perimeter region.

7. The micro-fuse assembly of claim 6, wherein the bond line is configured to be fusion-bonded between the topping wafer and the planar perimeter region.

8. The micro-fuse assembly of claim 7, wherein the perimetral sidewall and the canopy are a unitary component and are comprised of silicon, glass, or combinations thereof.

9. The micro-fuse assembly of claim 1, further comprising an insulating layer disposed on the substrate, wherein:
the plurality of thin-film micro-fuses is disposed on the insulating layer; and
each of the plurality of thin-film micro-fuses forms:
an inlet terminal;
an outlet terminal; and
a fuse element between the inlet terminal and the outlet terminal.

10. The micro-fuse assembly of claim 9, wherein each of the plurality of fuse elements is configured to:
melt and/or vaporize when conducting an electrical current that exceeds the program current value; and
re-solidify after melting and/or vaporizing, thereby forming a solidification globule proximate each associated inlet terminal and outlet terminal.

11. The micro-fuse assembly of claim 1, wherein each of the plurality of thin-film micro-fuses comprises aluminum.

12. The micro-fuse assembly of claim 1, wherein the topping wafer is configured to protect the plurality of thin-film micro-fuses from mechanical damage.

13. The micro-fuse assembly of claim 1, wherein the topping wafer further comprises one or more microcavities, each disposed on the topping wafer proximate to an associated precision circuit component.

14. A method of encapsulating a micro-fuse assembly comprising a substrate, a plurality of thin-film micro-fuses disposed on the substrate, each of the plurality of thin-film micro-fuses comprising a metallic material having a melting point that is less than 700° C., and one or more precision circuit components including precision thin-film resistors and/or precision thin-film capacitors, within an inert environment using a topping wafer configured to sealingly engage to at least one of the substrate or the plurality of thin-film micro-fuses or the one or more precision circuit components to define a cavity therebetween, the method comprising:
creating an inert environment around the micro-fuse assembly; and
bonding the topping wafer to the at least one of the substrate or the plurality of thin-film micro-fuses, thereby encapsulating the plurality of thin-film micro-fuses within the inert environment sealed within the cavity;
wherein the micro-fuse assembly is configured to program one or more of the precision circuit components by applying an electrical current that exceeds a program current value to one or more of the plurality of thin-film micro-fuses.

15. The method of claim 14, wherein:
the micro-fuse assembly defines a planar perimeter region;
the planar perimeter region surrounds the plurality of thin-film micro-fuses;
the topping wafer comprises a perimetral sidewall attached to a canopy; and
the perimetral sidewall is configured to be bonded to the planar perimeter region by a bond line, and to support the canopy from the planar perimeter region.

16. The method of claim 14, wherein:
the topping wafer is comprised of silicon, glass, or combinations thereof; and
the topping wafer is coated with a dielectric material.

17. The method of claim 14, wherein:
the inert environment comprises an inert gas;
the inert gas comprises nitrogen, argon, or mixtures thereof; and
the inert gas has a pressure that ranges from 0-200 KPa.

* * * * *